(12) United States Patent
Kwon

(10) Patent No.: US 11,336,292 B2
(45) Date of Patent: May 17, 2022

(54) ANALOG-DIGITAL CONVERTER AND MEMORY DEVICE INCLUDING ANALOG-DIGITAL CONVERTER

(71) Applicant: SK hynix Inc., Icheon-si (KR)

(72) Inventor: Chan Keun Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/217,245

(22) Filed: Mar. 30, 2021

(65) Prior Publication Data
US 2022/0109451 A1    Apr. 7, 2022

(30) Foreign Application Priority Data

Oct. 5, 2020    (KR) .................... 10-2020-0128203

(51) Int. Cl.
| | |
|---|---|
| *H03M 1/60* | (2006.01) |
| *H03M 1/46* | (2006.01) |
| *H03M 1/00* | (2006.01) |
| *H03M 1/66* | (2006.01) |
| *H03M 1/12* | (2006.01) |

(52) U.S. Cl.
CPC ............ *H03M 1/462* (2013.01); *H03M 1/001* (2013.01); *H03M 1/1245* (2013.01); *H03M 1/662* (2013.01)

(58) Field of Classification Search
CPC .......... H03M 1/468; H03M 1/00; H03M 1/46; H03M 1/68; H03M 1/002; H03M 1/10; H03M 1/1057; H03M 1/38; H03M 1/462; H03M 1/742; H03M 1/802; H03M 1/001; H03M 1/1023; H03M 1/1047; H03M 1/1061; H03M 3/464; H03M 1/0607; H03M 1/745

USPC ....... 341/126, 155, 161, 144, 172, 136, 137, 341/164, 165
See application file for complete search history.

(56) References Cited

U.S. PATENT DOCUMENTS

| | | | |
|---|---|---|---|
| 4,764,750 A * | 8/1988 | Kawada .............. | H03M 1/0678 341/122 |
| 5,661,483 A * | 8/1997 | Negahban ............... | H03M 1/68 341/161 |

(Continued)

FOREIGN PATENT DOCUMENTS

KR    1020160089922 A    7/2016

Primary Examiner — Linh V Nguyen
(74) Attorney, Agent, or Firm — William Park & Associates Ltd.

(57) ABSTRACT

The present disclosure relates to an electronic device. An analog-digital converter includes an input voltage provider configured to output the input voltage during a plurality of stages, a comparator configured to output a comparison result between the input voltage and one of a plurality of comparison reference voltages, a successive approximation register configured to output at least one bit among the plurality of bits of digital data based on the comparison result, and a digital-analog converter configured to provide the comparator with one comparison reference voltage among the plurality of the comparison reference voltages based on the at least one bit, wherein the digital-analog converter includes a plurality of transistors that are coupled in parallel with each other, the digital-analog converter configured to selectively receive a plurality of reference voltages to generate the one comparison reference voltage.

20 Claims, 17 Drawing Sheets

(56) References Cited

U.S. PATENT DOCUMENTS

| | | | | |
|---|---|---|---|---|
| 6,246,352 B1* | 6/2001 | Fattaruso | ............. | H03M 1/145 |
| | | | | 341/154 |
| 6,950,047 B1* | 9/2005 | Piasecki | ................. | H03M 1/68 |
| | | | | 341/131 |
| 9,276,597 B1* | 3/2016 | Chang | ................. | H03M 1/1023 |
| 9,285,778 B1* | 3/2016 | Evans | .................. | H03L 7/1075 |
| 9,866,227 B1* | 1/2018 | Bresciani | .............. | H03M 3/424 |
| 9,923,569 B1* | 3/2018 | Chen | .................... | H03M 1/002 |
| 2010/0110786 A1* | 5/2010 | Kang | ....................... | G11C 7/04 |
| | | | | 365/185.2 |
| 2010/0188277 A1* | 7/2010 | Aruga | ................. | H03M 1/1215 |
| | | | | 341/158 |
| 2018/0149526 A1* | 5/2018 | Abughazaleh | ...... | G06F 11/3058 |
| 2018/0358883 A1* | 12/2018 | Saputra | ................... | H03M 1/00 |
| 2020/0007082 A1 | 1/2020 | Robinson et al. | | |

\* cited by examiner

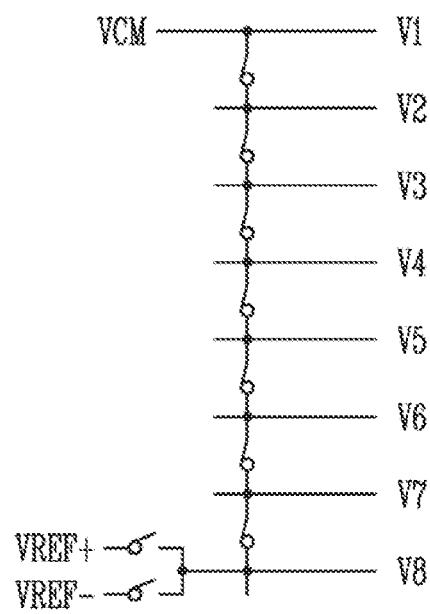

$V_n = (4V_{REF+} + 4V_{CM})/8$
$= 12/16 (V_{REF+} - V_{REF-})$

1XXX

B3=1

$V_n = (4V_{REF-} + 4V_{CM})/8$
$= 4/16 (V_{REF+} - V_{REF-})$

0XXX

B3=0

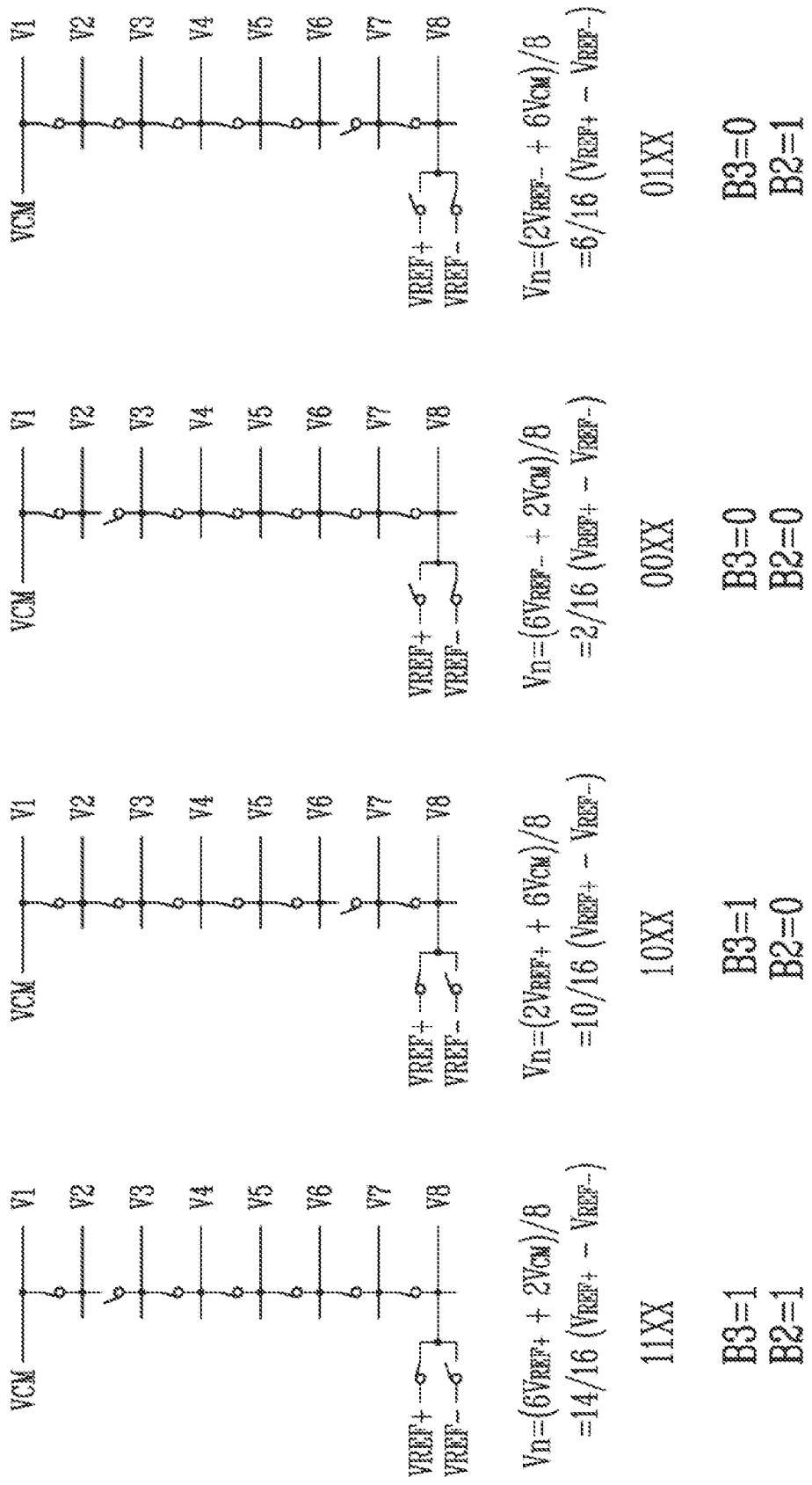

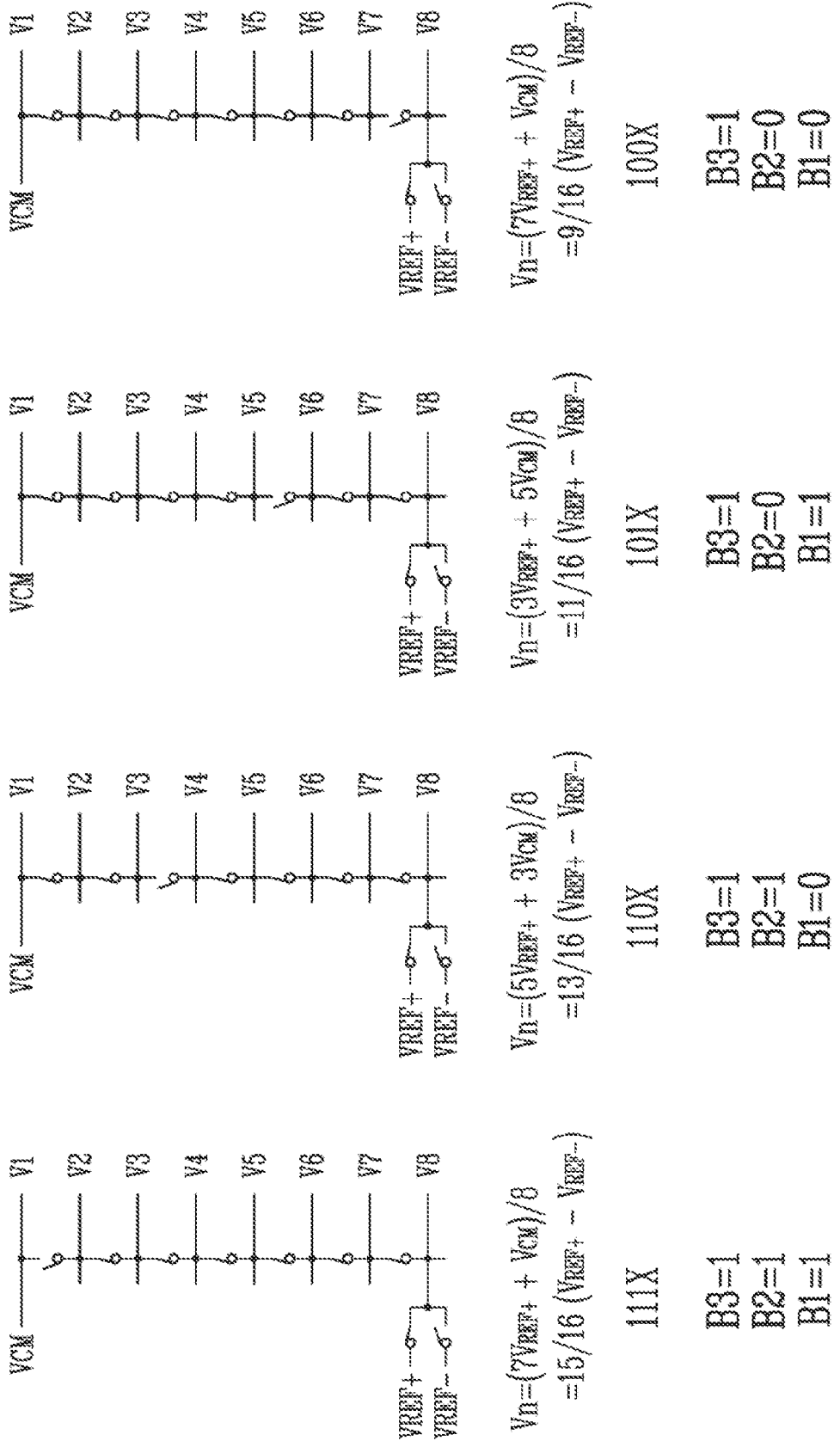

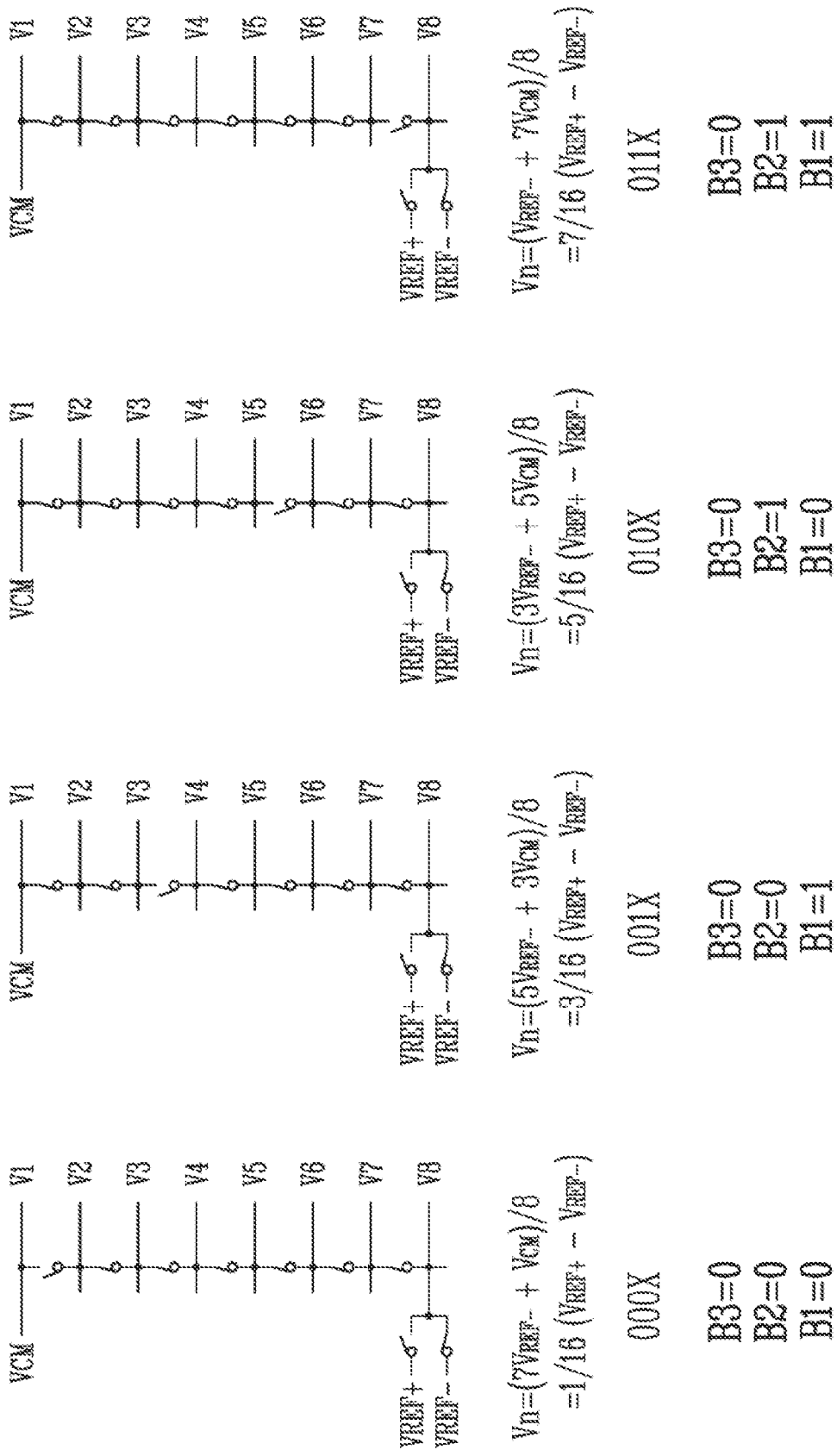

ANALOG-DIGITAL CONVERTER AND MEMORY DEVICE INCLUDING ANALOG-DIGITAL CONVERTER

CROSS-REFERENCE TO RELATED APPLICATION

The present application claims priority under 35 U.S.C. § 119(a) to Korean patent application number 10-2020-0128203 filed on Oct. 5, 2020, in the Korean intellectual Property Office, the entire disclosure of which is incorporated by reference herein.

BACKGROUND

1. Technical Field

Various embodiments of the invention relate generally to an electronic device, and more particularly, to an analog-to-digital (analog-digital) converter, a memory device including the analog-digital converter, and an operating method thereof.

2. Related Art

A storage device may store data in response to control of a host device such as a computer or a smartphone. The storage device may include a memory device that stores data and a memory controller that controls the memory device. Memory devices may be divided into volatile memory devices and non-volatile memory devices.

Memory cells included in a memory device may have operating characteristics that vary based on temperature. A memory device may include a temperature sensor so as to compensate for variations in operating voltages based on temperature. The temperature sensor of the memory device may include an analog-digital converter that senses temperature as a voltage corresponding to an analog signal and converts the sensed voltage signal into a digital signal. For example, types of analog-digital converters may include a flash type analog-digital converter, an analog-digital converter using a tracking scheme, a successive approximation register (SAR) type analog-digital converter (hereinafter, an "SAR-ADC"), and a pipeline analog-digital converter.

SUMMARY

According to an embodiment, an analog-digital converter outputting digital data corresponding to comparison results between an input voltage, which is an analog signal, and a plurality of comparison reference voltages may include an input voltage provider configured to output the input voltage during a plurality of stages, a comparator configured to output a comparison result between the input voltage and one of the plurality of comparison reference voltages, a successive approximation register configured to output at least one bit among the plurality of bits of the digital data based on the comparison result, and a digital-analog converter configured to provide the comparator with one comparison reference voltage among the plurality of comparison reference voltages based on the at least one bit, wherein the digital-analog converter includes a plurality of transistors that are coupled in parallel with each other, the digital-analog converter configured to selectively receive a plurality of reference voltages to generate the one comparison reference voltage.

An analog-digital converter may include a digital-analog converter configured to generate a plurality of comparison reference voltages from at least one reference voltage that is set beforehand and configured to output the plurality of comparison reference voltages, and a comparator with a first input terminal that is configured to receive an input voltage and a second input terminal that receives an output from the digital-analog converter, the comparator configured to output a result of comparing a voltage of the first input terminal with a voltage of the second input terminal, wherein the digital-analog converter includes a plurality of transistors with areas at a predetermined ratio with respect to an area of a transistor that receives the input voltage, coupled in parallel with each other, the digital-analog converter configured to selectively receive the at least one reference voltage.

A memory device may include a memory block with a plurality of memory cells storing data, a voltage generator configured to generate operating voltages that are used to access the plurality of memory cells, a temperature information generator configured to generate a temperature code based on internal temperature, and a control logic configured to control the voltage generator to control the operating voltages based on the temperature code, wherein the temperature information generator comprises a sensor configured to generate a temperature voltage signal being an analog signal that is determined based on the internal temperature, and an analog-digital converter configured to convert the temperature voltage signal into a digital signal, wherein the analog-digital converter comprises a comparator configured to output a comparison result between the temperature voltage signal and one of the plurality of comparison reference voltages, a successive approximation register configured to output at least one bit among the plurality of bits of the temperature code based on the comparison result, and a digital-analog converter configured to provide the comparator with one comparison reference voltage among the plurality of the comparison reference voltages based on the at least one bit, and wherein the digital-analog converter includes a plurality of transistors coupled in parallel with each other, the digital-analog converter configured to selectively receive a plurality of reference voltages to generate the one comparison reference voltage.

BRIEF DESCRIPTION OF THE DRAWINGS

FIG. 8 is a diagram illustrating a method of generating a comparison reference voltage that is applied in a first stage where a temperature voltage Vtemp is converted into a temperature code Temp Code as described with reference to FIG. 6;

FIGS. 10A, 10B, 10C and 10D are diagrams illustrating a method of generating a comparison reference voltage applied in a third stage where the temperature voltage Vtemp is converted into the temperature code Temp Code as described with reference to FIG. 6;

FIGS. 11A, 11B, 11C and 11D are diagrams illustrating an embodiment of a method of generating a comparison reference voltage that is applied in a fourth stage where the temperature voltage Vtemp is converted into the temperature code Temp Code as described with reference to FIG. 6;

FIGS. 12A, 12B, 12C and 12D are diagrams illustrating an embodiment of a method of generating a comparison reference voltage that is applied in a fourth stage where the temperature voltage Vtemp is converted into the temperature code Temp Code as described with reference to FIG. 6;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first" "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments are directed to an analog-digital converter with a reduced size, a memory device with the analog-digital converter, and an operating method thereof.

Figure 1:
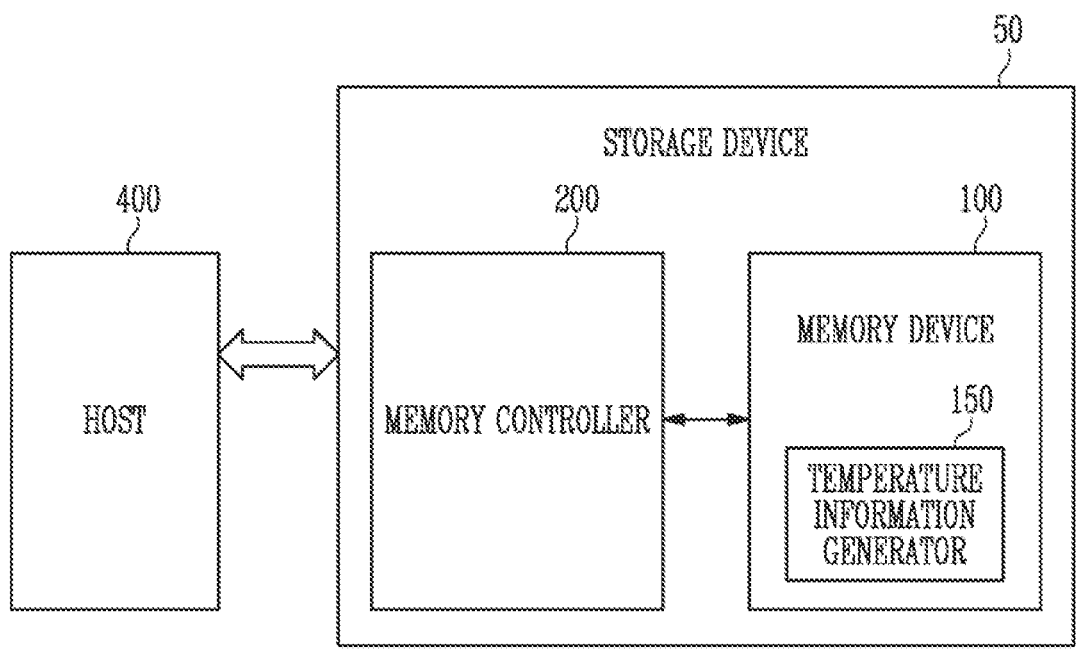
FIG. 1 is a diagram illustrating a storage device according to an embodiment of the present disclosure.

FIG. 1 is a diagram illustrating a storage device 50 according to an embodiment of the present disclosure.

Referring to FIG. 1, the storage device 50 may include a memory device 100 and a memory controller 200. The storage device 50 may be configured to store data in response to control of a host 400. Examples of the storage device 50 may include a cellular phone, a smartphone, an MP3 player, a laptop computer, a desktop computer, a game player, a TV, a tablet PC, and an in-vehicle infotainment system. However, the storage device 50 may be configured to store data in response to control of the host 400 storing high capacity data in a location, such as a server or a data center.

The storage device 50 may be manufactured as one of various types of storage devices based on a host interface corresponding to a communication method with the host 400. For example, the storage device 50 may be configured as any one of various kinds of storage devices, such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may operate in response to control of the memory controller 200. The memory device 100 may include a memory cell array (not shown) that includes a plurality of memory cells storing data.

Each of the memory cells may be a single level cell (SLC) that stores one data bit, a multi-level cell (MLC) that stores two data bits, a triple level cell (TLC) that stores three data bits, or a quad level cell (QLC) that stores four data bits.

A memory cell array (not shown) may include a plurality of memory blocks. Each of the memory blocks may include a plurality of memory cells. Each of the memory blocks may include a plurality of pages. According to an embodiment, a page may be a unit for storing data in the memory device 100 or reading data that is stored in the memory device 100. A memory block may be a unit for erasing data.

According to an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). For convenience of explanation, at is assumed that the memory device 100 is a NAND flash memory.

The memory device 100 may receive a command and an address from the memory controller 200 and access an area selected in response to the address in the memory cell array. The memory device 100 may perform an operation corresponding to the command on the area selected in response to the address. For example, the memory device 100 may perform a write operation (program operation), a read operation, and an erase operation. During a program operation, the memory device 100 may program data into the area selected in response to the address. During a read operation, the memory device 100 may read data from the area selected by the address. During an erase operation, the memory device 100 may erase data from the area selected by the address.

The memory device 100 may include a temperature information generator 150. The temperature information generator 150 may generate temperature information that reflects internal temperature of the memory device 100. According to an embodiment, the temperature information may be a temperature code which is in the form of a digital signal.

Characteristics of the memory cells included in the memory device 100 may vary based on temperature. For example, threshold voltages of the memory cells may be increased in a cold state where temperature is relatively low. On the other hand, threshold voltages of the memory cells may be decreased in a hot state where temperature is relatively high. Therefore, the memory device 100 may control a read voltage, a verify voltage, or a program voltages so as to compensate for variations of the threshold voltages of the memory cells based on temperature.

The memory controller 200 may control general operations of the storage device 50.

When power is applied to the storage device 50, the memory controller 200 may execute firmware FW. When the memory device 100 is a flash memory device, the memory controller 200 may execute firmware, such as a Flash Translation Layer (FTL) for controlling communication between the host 400 and the memory device 100.

According to an embodiment, the memory controller 200 may receive data and a logical address LA from the host 400 and convert the logical address LA into a physical address PA that indicates an address of memory cells where the data is stored in the memory device 100.

The memory controller 200 may control the memory device 100 so that a program operation, a read operation, or an erase operation may be performed in response to a request from the host 400. During a program operation, the memory controller 200 may provide a program command, a physical address, and data to the memory device 100. During a read operation, the memory controller 200 may provide a read command and a physical address to the memory device 100. During an erase operation, the memory controller 200 may provide an erase command and a physical address to the memory device 100.

According to an embodiment, the memory controller 200 may generate and transfer a command, an address, and data to the memory device 100 regardless of a request from the host 400. For example, the memory controller 200 may provide the memory device 100 with commands, addresses and data for performing a program operation, a read operation and erase operations associated with performing wear leveling, read reclaim, and garbage collection.

According to an embodiment, the memory controller 200 may control at least two memory devices 100. The memory controller 200 may control the memory devices 100 based on an interleaving scheme so as to improve operating performance. Based on the interleaving scheme, operations on at least two memory devices 100 may be controlled to overlap each other.

Figure 2:
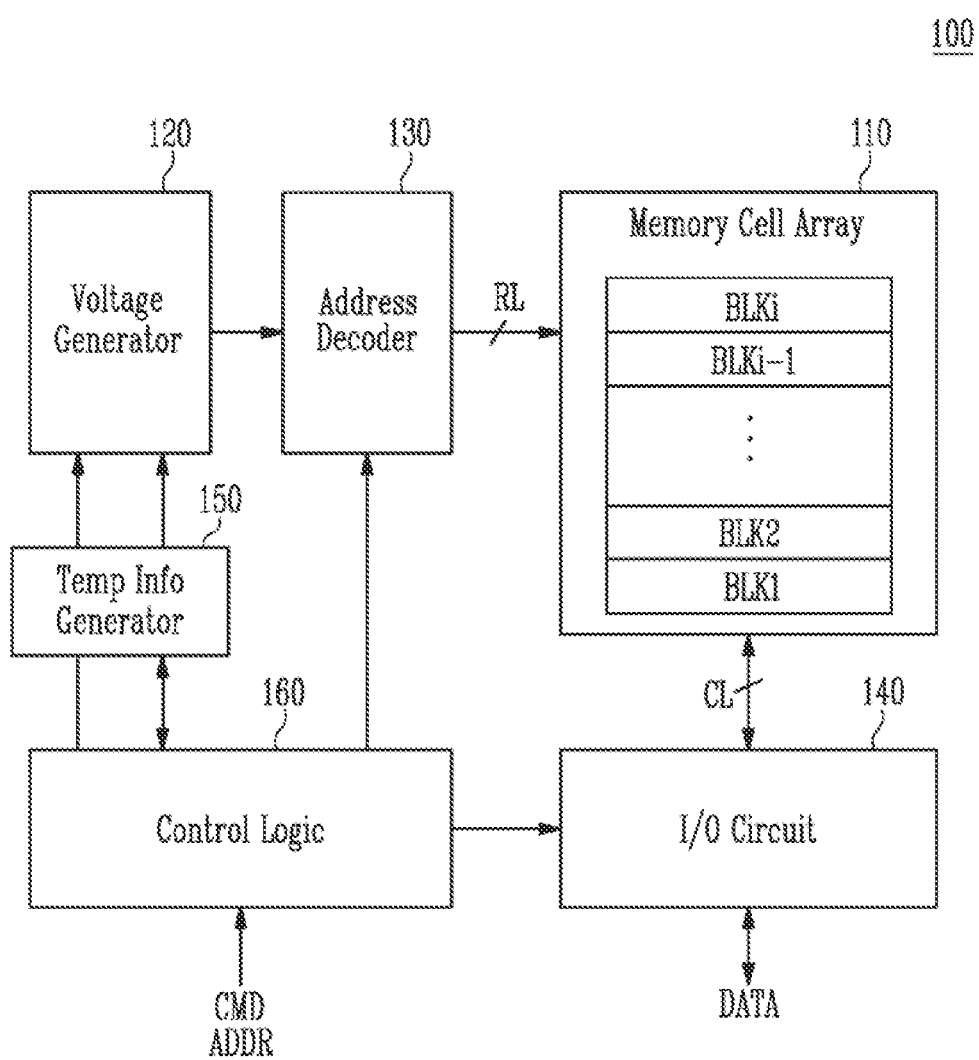
FIG. 2 is a diagram illustrating a memory device shown in FIG. 1.

The host 400 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods, FIG. 2 is a diagram illustrating the memory device 100 shown in FIG. 1.

Referring to FIG. 2, the memory device 100 may include a memory cell array 110, a voltage generator 120, an address decoder 130, an input/output circuit (I/O circuit) 140, the temperature information generator 150, and a control logic 160.

The memory cell array 110 may include a plurality of memory blocks BLK1 to BLKi. The plurality of memory blocks BLK1 to BLKi may be coupled to the address decoder 130 through row lines RL. The plurality of memory blocks BLK1 to BLKi may be coupled to the input/output circuit 140 through column lines CL. According to an embodiment, the row lines RL may include word lines, source select lines and drain select lines. According to an embodiment, the column lines CL may include bit lines.

Each of the plurality of memory blocks BLK1 to BLKi may include a plurality of memory cells. According to an embodiment, the plurality of memory cells may be nonvolatile memory cells. Memory cells coupled to the same word line, among the plurality of memory cells, may be defined as a single physical page. In other words, the memory cell array 110 may include a plurality of pages. The memory cells of the memory device 100 may include a single level cell (SLC) that stores a single data bit, a multi-level cell (MLC) that stores two data bits, a triple level cell (TLC) that stores three data bits, and a quad level cell (QLC) that stores four data bits.

Some of the plurality of memory blocks BLK1 to BLKi may be map data blocks that store map data as described with reference to FIG. 1. Other memory blocks may be normal blocks that store data requested by the host 400.

According to an embodiment, the voltage generator 120, the address decoder 130 and the input/output circuit 140 may be collectively referred to as a peripheral circuit. The peripheral circuit may drive the memory cell array 110 in response to the control logic 160. The peripheral circuit may drive the memory cell array 110 to perform a program operation, a read operation and an erase operation.

The voltage generator 120 may be configured to generate a plurality of operating voltages by using an external power voltage supplied to the memory device 100. The voltage generator 120 may be controlled by the control logic 160.

According to an embodiment, the voltage generator 120 may generate an internal power voltage by regulating the external power voltage. The internal power voltage that is generated by the voltage generator 120 may serve as an operating voltage of the memory device 100.

According to an embodiment, the voltage generator 120 may generate a plurality of operating voltages by using the external power voltage or the internal power voltage. The voltage generator 120 may be configured to generate various voltages that are required by the memory device 100. For example, the voltage generator 120 may generate a plurality of erase voltages, a plurality of program voltages, a plurality of pass voltages, a plurality of selected read voltages, and a plurality of unselected read voltages.

The voltage generator 120 may include a plurality of pumping capacitors that receive the internal power voltage to generate a plurality of operating voltages with various voltage levels. The voltage generator 120 may generate a plurality of operating voltages by selectively activating the plurality of pumping capacitors in response to control of the control logic 160.

The generated operating voltages may be supplied to the memory cell array 110 by the address decoder 130.

The address decoder 130 may be coupled to the memory cell array 110 through the row lines RL. The address decoder 130 may be configured to operate in response to the control logic 160. The address decoder 130 may receive an address ADDR from the control logic 160. The address decoder 130 may be configured to decode a block address of the received address ADDR. The address decoder 130 may select at least one memory block, among the memory blocks BLK1 to BLKi, based on the decoded block address. The address decoder 130 may be configured to decode a row address of the received address ADDR. The address decoder 130 may select at least one of word lines of the selected memory block based on the decoded row address. According to an embodiment, the address decoder 130 may be configured to decode a column address of the received address ADDR. The address decoder 130 may connect the input/output circuit 140 and the memory cell array 110 based on the decoded column address.

For example, the address decoder 130 may include components, such as a row decoder, a column decoder and an address buffer.

The input/output circuit 140 may include a plurality of page buffers. The plurality of page buffers may be coupled to the memory cell array 110 through bit lines.

During a program operation, data may be stored in selected memory cells based on data that is stored in the plurality of page buffers. During a read operation, the data that is stored in the selected memory cells may be sensed through the bit lines, and the sensed data may be stored in the page buffers.

The temperature information generator 150 may measure internal temperature of the memory device 100 and may provide a temperature code corresponding to the internal temperature to the voltage generator 120 and the control logic 160. The control logic 160 may control levels of operating voltages to be generated by the voltage generator 120 based on the temperature code. When the internal temperature of the memory device 100 is relatively high, threshold voltages of the memory cells may be reduced. However, when the internal temperature of the memory device 100 is relatively low, the threshold voltages of the memory cells may be increased. Therefore, the control logic 160 may control the voltage generator 120 to generate a read voltage that is decreased by a predetermined level in response to the temperature code corresponding to the internal temperature that is higher than critical temperature. However, the control logic 160 may control the voltage generator 120 to generate a read voltage that is increased by a predetermined level in response to the temperature code corresponding to the internal temperature that is lower than the critical temperature.

According to an embodiment, the control logic 160 may control the voltage generator 120 to generate a program voltage that is increased by a predetermined level in response to the temperature code corresponding to the internal temperature that is higher than the critical temperature. However, the control logic 160 may control the voltage generator 120 to generate a program voltage that is decreased by a predetermined level in response to the temperature code corresponding to the internal temperature that is lower than the critical temperature.

According to an embodiment, the temperature code may be an m-bit digital code.

The control logic 160 may control the voltage generator 120, the address decoder 130, the input/output circuit 140, and the temperature information generator 150. The control logic 160 may operate in response to a command CMD that is transferred from an external device (e.g., a memory controller). The control logic 160 may control peripheral circuits by generating control signals in response to the command CMD and the address ADDR.

Figure 3:
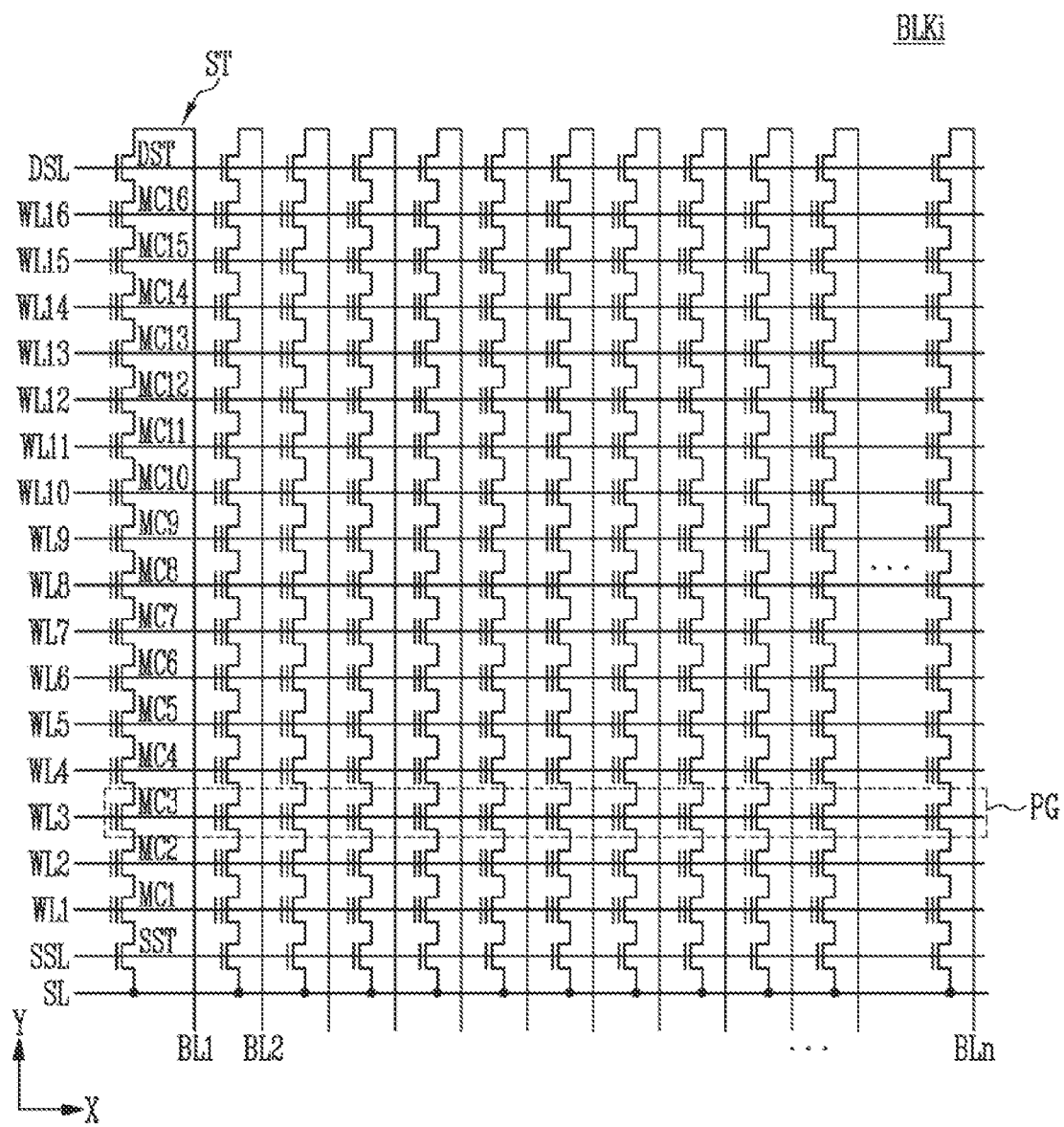
FIG. 3 is a diagram illustrating the structure of any one of memory blocks of FIG. 2.

FIG. 3 is a diagram illustrating the structure of one of the memory blocks BLK1 to BLKi of FIG. 2.

The memory block BLKi, one of the memory blocks BLK1 to BLKi of FIG. 2, is shown in FIG. 3.

Referring to FIG. 3, a plurality of word lines that are arranged in parallel with each other may be coupled between a first select line and a second select line. The first select line may be a source select line SSL and the second select line may be a drain select line DSL. More specifically, the memory block BLKi may include a plurality of strings ST that are coupled between bit lines BL1 to BLn and a source line SL. The bit lines BL1 to BLn may be coupled to the strings ST, respectively, and the source line SL may be commonly coupled to the strings ST. The strings ST may have the same configuration. Thus, the string ST that is coupled to the first bit line BL1 will be described in detail as an example.

The string ST may include a source select transistor SST, a plurality of memory cells MC1 to MC16, and a drain select transistor DST that are coupled in series to each other between the source line SL and the first bit line BL1. Each string ST may include at least one source select transistor SST, at least one drain select transistor DST, and more memory cells than the memory cells MC1 to MC16 as shown in FIG. 3.

A source of the source select transistor SST may be coupled to the source line SL and a drain of the drain select transistor DST may be coupled to the first bit line BL1. The memory cells MC1 to MC16 may be coupled in series between the source select transistor SST and the drain select transistor DST. Gates of the source select transistors SST that are included in different strings ST may be coupled to the source select line SSL. Gates of the drain select transistors DST may be coupled to the drain select line DSL. Gates of the memory cells MC1 to MC16 may be coupled to a plurality of word lines WL1 to WL16, respectively. A group of memory cells that is coupled to the same word line, among the memory cells that are included in the different strings ST, may be referred to as a physical page PG. Therefore, the memory block BLKi may include as many physical pages PG as the number of word lines WL1 to WL16.

A single memory cell may store one bit of data. This memory cell is generally called a single level cell (SLC). One physical page PG may store one logical page (LPG) data. One LPG data may include as many data bits as the number of cells included in one physical page PG.

One memory cell may store two or more bits of data. One physical page PG may store data corresponding to two or more logical pages LPG.

Figure 4:
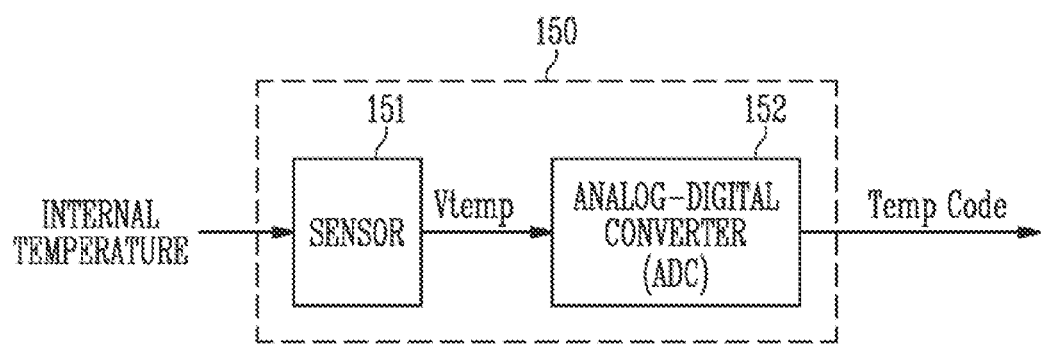
FIG. 4 is a diagram of a temperature information generator of FIG. 2.

FIG. 4 is a diagram of the temperature information generator 150 of FIG. 2.

Referring to FIG. 4, the temperature information generator 150 may include a sensor 151 and an analog-digital converter 152.

The sensor 151 may sense internal temperature of the memory device 100. The sensor 151 may generate the temperature voltage Vtemp that reflects the internal temperature of the memory device 100 and may provide the generated temperature voltage Vtemp to the analog-digital converter 152. The temperature voltage Vtemp may be an analog signal.

The analog-digital converter 152 may receive the temperature voltage Vtemp, which is an analog signal, and may convert the temperature voltage Vtemp into the temperature code Temp Code, which is a digital signal. According to an embodiment, the analog-digital converter 152 may be one of a flash type analog-digital converter, an analog-digital converter using a tracking scheme, an SAR ADC, and a pipeline ADC. In the present specification, a case in which the analog-digital converter 152 is an SAR ADC will be described as an example. According to an embodiment, the temperature code Temp Code may include a plurality of data bits based on an implementation method of the analog-digital converter 152.

Figure 5:
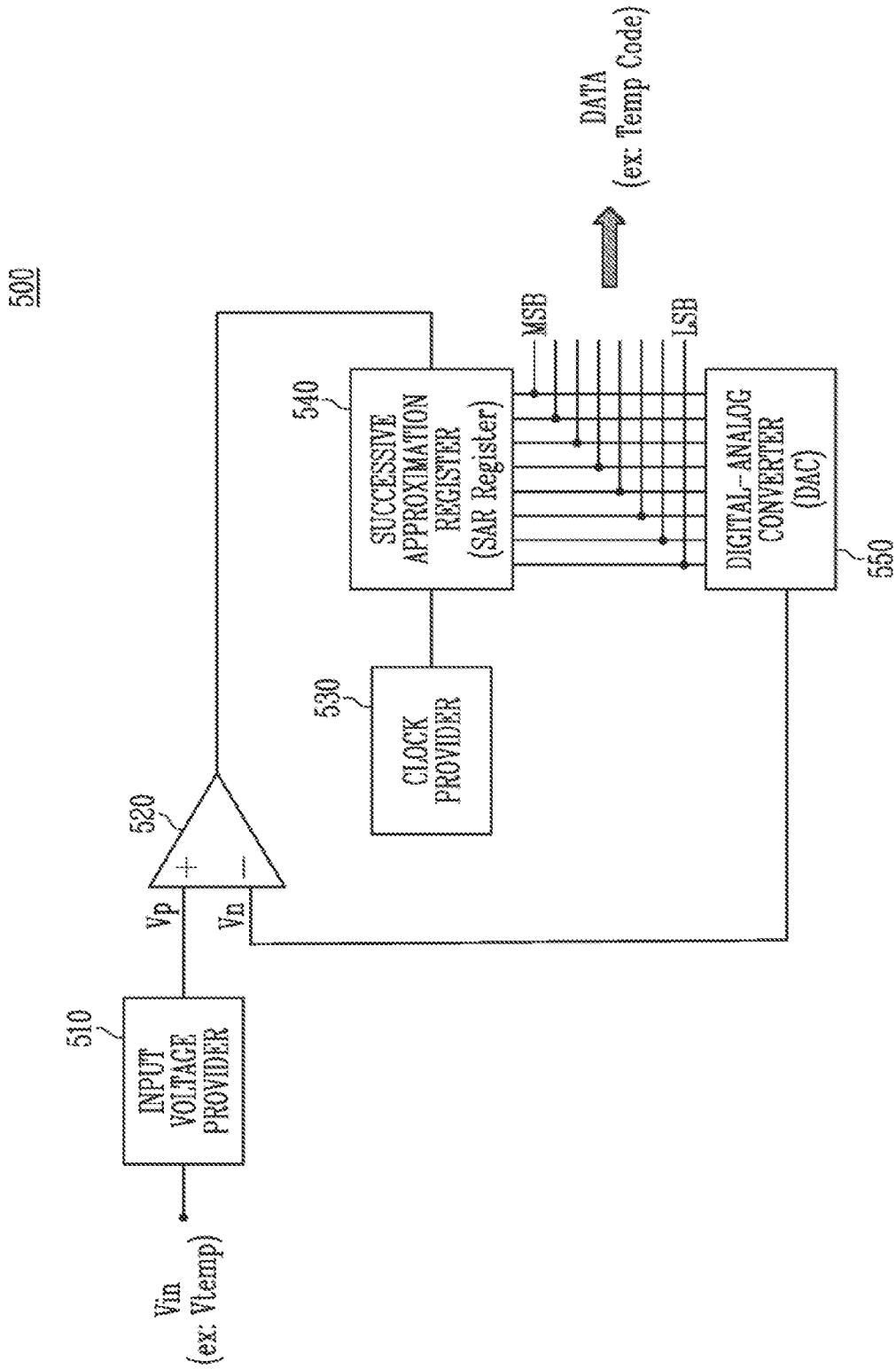
FIG. 5 is a diagram illustrating an example of an analog-digital converter of FIG. 4.

FIG. 5 is a diagram illustrating an example of the analog-digital converter 152 of FIG. 4.

Referring to FIG. 5, an analog-digital converter 500 may include an input voltage provider 510, a comparator 520, a dock provider 530, a successive approximation register 540, and a digital-to-analog (digital-analog) converter 550.

The input voltage provider 510 may receive and sample an input voltage Vin. The input voltage provider 510 may provide the sampled value of the input voltage yin as a voltage Vp to be input to a non-inverting terminal (+) of the comparator 520. According to an embodiment, the input voltage provider 510 may hold the sampled value of the input voltage Vin until a comparison operation of the comparator 520 is completed and may provide the sample value as the voltage Vp to be input to the non-inverting terminal (+).

The comparator 520 may compare the voltage Vp that is input to the non-inverting terminal (+) with a voltage Vn that is input to an inverting terminal (−) and may provide a comparison result to the successive approximation register 540. The comparison result may be information that indicates whether the voltage Vp that is input to the non-inverting terminal (+) is larger or smaller than the voltage Vn that is input to the inverting terminal (−).

The successive approximation register 540 may convert the comparison result of the comparator 520 into digital data based on a clock that is input by the clock provider 530. The output of the successive approximation register 540 may be digital data that include a plurality of bits. For example, the output of the successive approximation register 540 may be the temperature code Temp Code. According to an embodiment, the number of bits of the data that are included in the output of the successive approximation register 540 may be equal to the number of times the comparator 520 compares the voltage Vp that is input to the non-inverting terminal (+) with the voltage Vn that is input to the inverting terminal (−). As the number of times the voltage Vp that is input to the non-inverting terminal (+) is compared with the voltage Vn that is input to the inverting terminal (−) increases, the number of bits of the data that is included in the output of the successive approximation register 540 may increase. According to an embodiment, the number of bits of the data that is included in the output of the successive approximation register 540 may be equal to the number of clocks that are input by the clock provider 530. As the number of bits of the data that is included in the output of the successive approximation register 540 increases, it may be possible to generate the temperature code Temp Code with more accurate temperature measurement.

The digital-analog converter 550 may provide the voltage Vn that is input to the inverting terminal (−) of the comparator 520. The digital-analog converter 550 may generate reference voltages to be input to the inverting terminal (−) based on the data that is included in the output of the successive approximation register 540. The digital-analog converter 550 may convert the data that is included in the output of the successive approximation register 540 into a comparison reference voltage which is an analog signal, and may provide the comparison reference voltage as the voltage Vn that is input to the inverting terminal (−).

Figure 6:
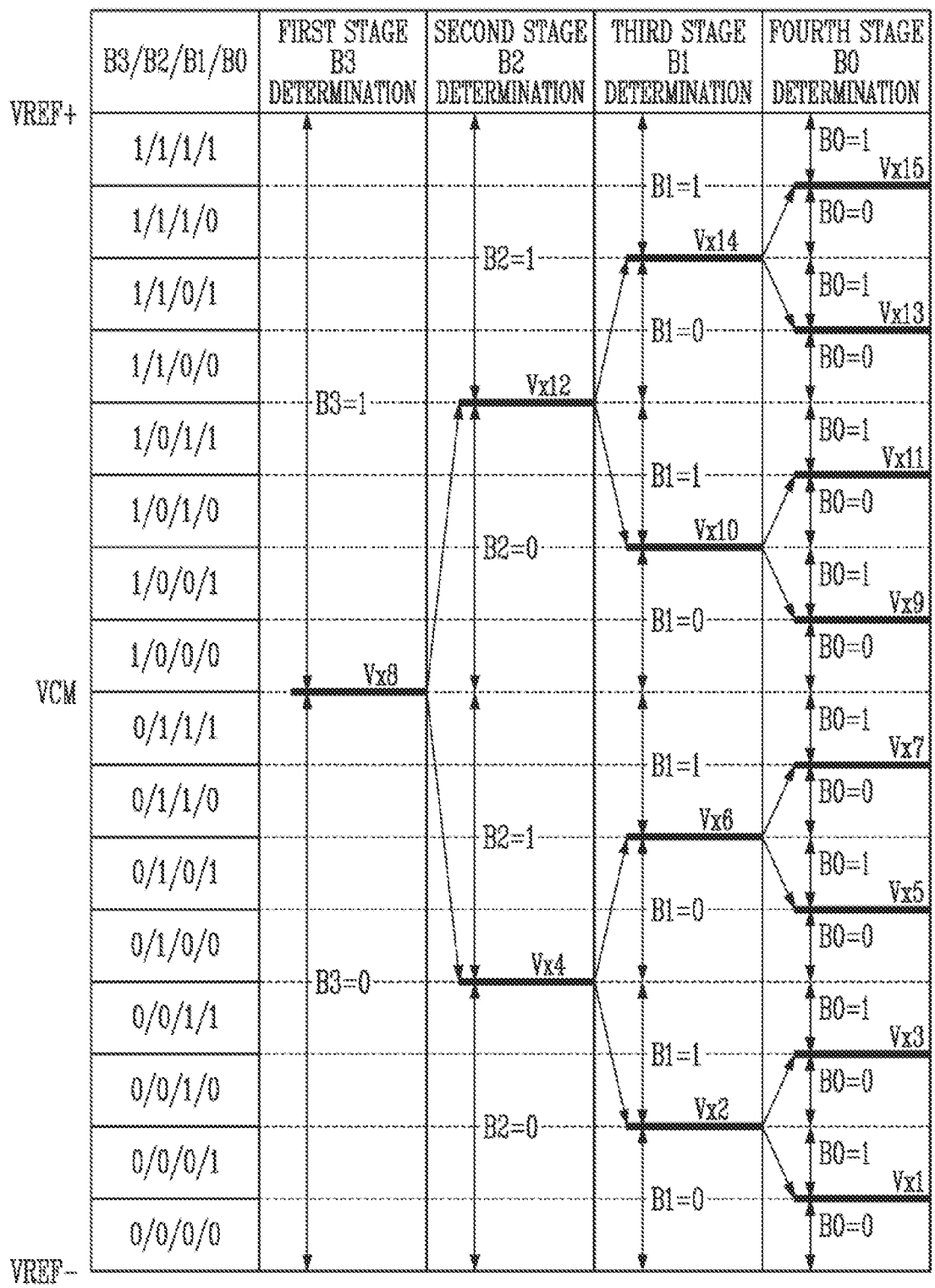
FIG. 6 is a diagram illustrating operations of an analog-digital converter of FIG. 5.

FIG. 6 is a diagram illustrating operations of the analog-digital converter 500 of FIG. 5.

Referring to FIGS. 5 and 6, the analog-digital converter 500 may convert the temperature voltage Vtemp into the temperature code Temp Code. The temperature code Temp Code may be digital data with a 4-bit length that consists of B3/B2/B1/B0. The most significant bit (MSB) of the temperature code Temp Code may be B3, and the least significant bit (LSB) may be B0.

B3 that is the most significant bit (MSB) may be determined in the first stage. B2 may be determined in the second stage, B1 may be determined in the third stage, and B0 that is the least significant bit (LSB) may be determined in the fourth stage.

The input voltage provider 510 may sample the temperature voltage Vtemp that is the input voltage Vin and may provide the sampled value of the temperature voltage Vtemp as the voltage Vp that is input to the non-inverting terminal (+) of the comparator 520 during the first to fourth stages.

The analog-digital converter 500 may convert the temperature voltage Vtemp into the temperature code Temp Code by using a binary search method.

Since the temperature code Temp Code corresponding to the output of the analog-digital converter 500 has a 4-bit length, one temperature code Temp Code among 16(2^4) temperature codes may be output. Voltages between the 16 temperature codes Temp Code may correspond to temperature values that are obtained by dividing voltages from the lowest second reference voltage VREF− to the highest first reference voltage VREF+ into 16 voltage values. Therefore, the temperature code Temp Code may be determined based on which interval, among 16 intervals where first to 15th comparison reference voltages Vx1 to Vx15 are formed, the temperature voltage Vtemp belongs to.

In the first stage, the digital-analog converter 550 may provide the voltage Vn that is input to the inverting terminal (−) of the comparator 520. In the first stage, the voltage Vn that is input to the inverting terminal (−) of the comparator 520 may be the eighth comparison reference voltage Vx8 that has an intermediate voltage level between the first reference voltage VREF+ and the second reference voltage VREF−. The comparator 520 may compare the magnitude between the temperature voltage Vtemp and the eighth comparison reference voltage Vx8 and may provide a comparison result to the successive approximation register 540. The successive approximation register 540 may determine B3, which is the most significant bit (MSB), as "1" in response to the comparison result that the temperature voltage Vtemp is greater than the eighth comparison reference voltage Vx8. On the other hand, the successive approximation register 540 may determine B3, which is the most significant bit (MSB), as "0" in response to the comparison result that the temperature voltage Vtemp is smaller than or equal to the eighth comparison reference voltage Vx8.

The digital-analog converter 550 may generate the voltage Vn that is input to the inverting terminal (−) of the comparator 520 in the second stage, based on B3 that is the most significant bit (MSB). For example, in response to the output of the successive approximation register 540 that B3, which is the most significant bit (MSB), is "1", the digital-analog converter 550 may output the 12th comparison reference voltage Vx12 that is an intermediate voltage between the eighth comparison reference voltage Vx8 and the first reference voltage VREF+ as the voltage Vn that is input to the inverting terminal (−) of the comparator 520. Alternatively, however, in response to the output of the successive approximation register 540 that B3, which is the most significant bit (MSB), is "0", the digital-analog converter 550 may output the fourth comparison reference voltage Vx4 that is an intermediate voltage between the eighth comparison reference voltage Vx8 and the second reference voltage VREF− as the voltage Vn that is input to the inverting terminal (−) of the comparator 520.

When it is assumed that B3, which is the most significant bit (MSB), is 1, in the second stage, the comparator 520 may compare the magnitude between the temperature voltage Vtemp and the 12th comparison reference voltage Vx12 and may provide a comparison result to the successive approximation register 540. The successive approximation register 540 may determine B2 as "1" in response to the comparison result that the temperature voltage Vtemp is greater than the 12th comparison reference voltage Vx12. On the other hand, the successive approximation register 540 may determine B2 as "0" in response to the comparison result that the temperature voltage Vtemp is smaller than or equal to the 12th comparison reference voltage Vx12.

In response to the output of the successive approximation register 540 that B3, which is the most significant bit (MSB), is "1" and B2, which is the second bit, is "1", the digital-analog converter 550 may output the 14th comparison reference voltage Vx14 that is an intermediate voltage between the 12th comparison reference voltage Vx12 and the first reference voltage VREF+ as the voltage Vn that is input to the inverting terminal (−) of the comparator 520. On the other hand, in response to the output of the successive approximation register 540 that B3, which is the most significant bit (MSB), is "1" and B2, which is the second bit, is "0", the digital-analog converter 550 may output the 10th comparison reference voltage Vx10 that is an intermediate voltage between the 12th comparison reference voltage Vx12 and the eighth comparison reference voltage Vx8 as the voltage Vn that is input to the inverting terminal (−) of the comparator 520.

When it is assumed that B2, which is the second bit, is "1", in the third stage, the comparator 520 may compare the magnitude between the temperature voltage Vtemp and the 14th comparison reference voltage Vx14 and may provide a comparison result to the successive approximation register 540. The successive approximation register 540 may determine B1 as "1" in response to the comparison result that the temperature voltage Vtemp is greater than the 14th comparison reference voltage Vx14. On the other hand, the successive approximation register 540 may determine B1 as "0" in response to the comparison result that the temperature voltage Vtemp is smaller than or equal to the 14th comparison reference voltage Vx14.

In response to the output of the successive approximation register 540 that B3, which is the most significant bit (MSB), is "1", B2, which is the second bit, is "1", and B1, which is the third bit, is "1", the digital-analog converter 550 may output the 15th comparison reference voltage Vx15 that is an intermediate voltage between the 14th comparison reference voltage Vx14 and the first reference voltage VREF+ as the voltage Vn that is input to the inverting terminal (−) of the comparator 520. Alternatively, in response to the output of the successive approximation register 540 that B3, which is the most significant bit (MSB), is "1", B2, which is the second bit is "1", and B1, which is the third bit, is "0", the digital-analog converter 550 may output the 13th comparison reference voltage Vx13 that is an intermediate voltage between the 14th comparison reference voltage Vx14 and the 12th comparison reference voltage Vx12 as the voltage Vn that is input to the inverting terminal (−) of the comparator 520.

When it is assumed that B3, which is the most significant bit (MSB), is "1" B2, which is the second bit, is "1" and B1, which is the third bit, is "1", in the fourth stage, the comparator 520 may compare the magnitude between the temperature voltage Vtemp, and the 15th comparison reference voltage Vx15 and may provide a comparison result to the successive approximation register 540. The successive approximation register 540 may determine B0 as "1" in response to the comparison result that the temperature voltage Vtemp is greater than the 15th comparison reference voltage Vx15. On the other hand, the successive approximation register 540 may determine B0 as "0" in response to the comparison result that the temperature voltage Vtemp is smaller than or equal to the 15th comparison reference voltage Vx15.

By using the above method, the temperature voltage Vtemp may be converted into the temperature code Temp Code as shown below in [Table 1]. The analog-digital converter as shown in the embodiment of FIG. 6 is referred to as an "SAR-ADC."

TABLE 1

| Vtemp | Temp Code |
|---|---|
| VREF− < Vtemp ≤ V × 1 | 0000 |
| V × 1 < Vtemp ≤ V × 2 | 0001 |
| V × 2 < Vtemp ≤ V × 3 | 0010 |
| V × 3 < Vtemp ≤ V × 4 | 0011 |
| V × 4 < Vtemp ≤ V × 5 | 0100 |
| V × 5 < Vtemp ≤ V × 6 | 0101 |
| V × 6 < Vtemp ≤ V × 7 | 0110 |
| V × 7 < Vtemp ≤ V × 8 | 0111 |
| V × 8 < Vtemp ≤ V × 9 | 1000 |
| V × 9 < Vtemp ≤ V × 10 | 1001 |
| V × 10 < Vtemp ≤ V × 11 | 1010 |
| V × 11 < Vtemp ≤ V × 12 | 1011 |
| V × 12 < Vtemp ≤ V × 13 | 1100 |
| V × 13 < Vtemp ≤ V × 14 | 1101 |
| V × 14 < Vtemp ≤ V × 15 | 1110 |
| V × 15 < Vtemp ≤ VREF+ | 1111 |

Figure 7:
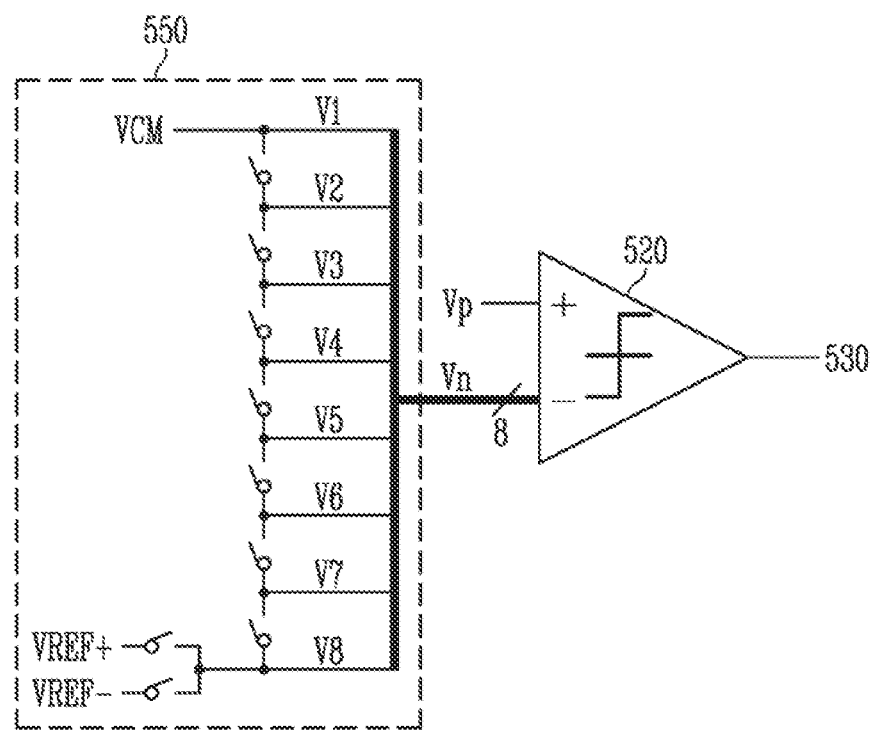
FIG. 7 is a diagram illustrating the structure of a digital-analog converter of FIG. 6.

FIG. 7 is a diagram illustrating the structure of the digital-analog converter 550 of FIG. 6.

Referring to FIGS. 5, 6, and 7, the digital-analog converter 550 that is included in the analog-digital converter 500, according to an embodiment, may generate the first to 15th comparison reference voltages Vx1 to Vx15 in response to the output of the successive approximation register 540. When the temperature code Temp Code has a data length that exceeds four bits, the digital-analog converter 550 may generate more comparison reference voltages.

According to an embodiment, the digital-analog converter 550 may generate the first to 15th comparison reference voltages Vx1 to Vx15 by coupling reference voltages that has three levels, i.e., the first reference voltage VREF+, an intermediate reference voltage VCM, and the second reference voltage VREF− that are in parallel with eight transistors, each of which has an area that is ⅛ of the area of a switch transistor that is coupled to the non-inverting terminal (+) of the comparator 520. More specifically, the method by which the digital-analog converter 550 generates the first to 15th comparison reference voltages Vx1 to Vx15 by coupling the reference voltages with the three levels, i.e., the first reference voltage VREF+, the intermediate reference voltage VCM, and the second reference voltage VREF− that are in parallel with the eight transistors each with the area which is ⅛ of the area of the switch transistor that is coupled to the non-inverting terminal (+) of the comparator 520 will be described below in more detail with reference to FIGS. 8 to 12D.

FIG. 8 is a diagram illustrating a method of generating a comparison reference voltage that is applied in a first stage in which the temperature voltage Vtemp is converted into the temperature code Temp Code as described with reference to FIG. 6.

Referring to FIGS. 5, 6, and 8, first to eighth voltages V1 to V8 that are different from each other may be applied to gate electrodes of the first to eighth transistors.

A comparison reference voltage that is used in the first stage may be the intermediate reference voltage VCM, i.e., the eighth comparison reference voltage Vx8. To generate the eighth comparison reference voltage Vx8, the digital-analog converter 550 may bias each of the first to eighth voltages V1 to V8 with the intermediate reference voltage VCM. Therefore, the voltage Vn, which is input to the inverting terminal (−) of the comparator 520, may be (8/16) *((first reference voltage (VREF+)—second reference voltage (VREF−)).

Figure 9A:
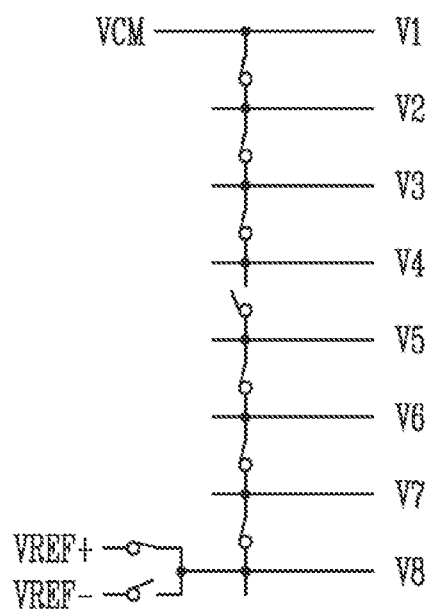
FIGS. 9A and 9B are diagrams illustrating a method of generating a comparison reference voltage applied in a second stage where the temperature voltage Vtemp is converted into the temperature code Temp Code as described with reference to FIG. 6.
Figure 9B:
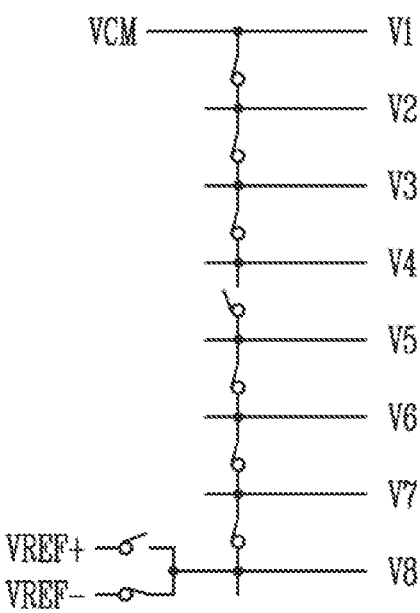

FIGS. 9A and 9B are diagrams illustrating a method of generating a comparison reference voltage applied in the second stage in which the temperature voltage Vtemp is converted into the temperature code Temp Code as described with reference to FIG. 6.

Referring to FIGS. 5, 6, 9A and 9B, the first to eighth voltages V1 to V8 that are different from each other may be applied to the gate electrodes of the first to eighth transistors.

FIG. 9A illustrates a voltage that is applied to the first to eighth transistors when B3, corresponding to the most significant bit (MSB), is 1, and the voltage Vn that is applied to the inverting terminal (−) of the comparator 520.

A comparison reference voltage that is used in the second stage when B3 is 1 may be the 12th comparison reference voltage Vx12. To generate the 12th comparison reference voltage Vx12, the digital-analog converter 550 may apply the intermediate reference voltage VCM to the gates of the first to fourth transistors and may apply the first reference voltage VREF+ to the gates of the fifth to eighth transistors. As a result, the voltage Vn that is input to the inverting terminal (−) of the comparator 520 may be (12/16) ((first reference voltage (VREF+)-second reference voltage (VREF−)).

FIG. 9B illustrates a voltage that is applied to the first to eighth transistors when B3, corresponding to the most significant bit (MSB), is 0, and the voltage Vn that is applied to the inverting terminal (−) of the comparator 520.

A comparison reference voltage that is used in the second stage when B3 is 0 may be the fourth comparison reference voltage Vx4. To generate the fourth comparison reference voltage Vx4, the digital-analog converter 550 may apply the intermediate reference voltage VCM to the gates of the first to fourth transistors and may apply the second reference voltage VREF− to the gates of the fifth to eighth transistors. As a result, the voltage Vn that is input to the inverting terminal (−) of the comparator 520 may be (4/16) ((first reference voltage (VREF+)-second reference voltage (VREF−)).

FIGS. 10A, 10B, 10C and 10D are diagrams illustrating a method of generating a comparison reference voltage applied in the third stage in which the temperature voltage Vtemp is converted into the temperature code Temp Code as described with reference to FIG. 6.

Referring to FIGS. 5, 6, 10A, 10B, 10C and 10D, the first to eighth voltages V1 to V8 that are different from each other may be applied to the gate electrodes of the first to eighth transistors.

FIG. 10A illustrates a voltage that is applied to the first to eighth transistors when B3, corresponding to the most significant bit (MSB), is 1 and B2 is 1, and the voltage Vn that is applied to the inverting terminal (−) of the comparator 520.

A comparison reference voltage that is used in the third stage when B3 is 1 and B2 is 1 may be the 14th comparison reference voltage Vx14. To generate the 14th comparison reference voltage Vx14, the digital-analog converter 550 may apply the intermediate reference voltage VCM to the gates of the first and second transistors and may apply the first reference voltage VREF+ to the gates of the third to eighth transistors. As a result, the voltage Vn that is input to the inverting terminal (−) of the comparator 520 may be (14/16)*((first reference voltage (VREF+)-second reference voltage (VREF−)).

FIG. 10B illustrates a voltage that is applied to the first to eighth transistors when B3, corresponding to the most significant bit (MSB), is 1 and B2 is 0, and the voltage Vn that is applied to the inverting terminal (−) of the comparator 520.

A comparison reference voltage that is used in the third stage when B3 is 1 and B2 is 0 may be the 10th comparison reference voltage Vx10. To generate the 10th comparison reference voltage Vx10, the digital-analog converter 550 may apply the intermediate reference voltage VCM to the gates of the first to sixth transistors and may apply the first reference voltage VREF+ to the gates of the seventh and eighth transistors. As a result, the voltage Vn that is input to the inverting terminal (−) of the comparator 520 may be (10/16)*((first reference voltage (VREF+)-second reference voltage (VREF−)).

FIG. 10C illustrates a voltage that is applied to the first to eighth transistors when B3, corresponding to the most significant bit (MSB), is 0 and B2 is 0, and the voltage Vn that is applied to the inverting terminal (−) of the comparator 520.

A comparison reference voltage that is used in the third stage when B3 is 0 and B2 is 0 may be the second comparison reference voltage Vx2. To generate the second comparison reference voltage Vx2, the digital-analog converter 550 may apply the intermediate reference voltage VCM to the gates of the first and second transistors and may apply the first reference voltage VREF+ to the gates of the third to eighth transistors. As a result, the voltage Vn that is input to the inverting terminal (−) of the comparator 520 may be (2/16) ((first reference voltage (VREF+)-second reference voltage (VREF−)).

FIG. 10D illustrates a voltage that is applied to the first to eighth transistors when B3, corresponding to the most significant bit (MSB), is 0 and B2 is 1, and the voltage Vn that is applied to the inverting terminal (−) of the comparator 520.

A comparison reference voltage that is used in the third stage when B3 is 0 and B2 is 1 may be the sixth comparison reference voltage Vx6. To generate the sixth comparison reference voltage Vx6, the digital-analog converter 550 may apply the intermediate reference voltage VCM to the gates of the first to sixth transistors and may apply the second reference voltage VREF− to the gates of the seventh and eighth transistors. As a result, the voltage Vn that is input to the inverting terminal (−) of the comparator 520 may be (6/16)*((first reference voltage (VREF+)-second reference voltage (VREF−)).

FIGS. 11A, 11B, 11C and 11D are diagrams illustrating an example of a method of generating a comparison reference voltage that is applied in the fourth stage in which the temperature voltage Vtemp is converted into the temperature code Temp Code as described with reference to FIG. 6.

Referring to FIGS. 5, 6, 11A, 11B, 11C and 11D, the first to eighth voltages V1 to V8 that are different from each other may be applied to gate electrodes of the first to eighth transistors.

FIG. 11A illustrates a voltage that is applied to the first to eighth transistors when B3, corresponding to the most significant bit (MSB), is 1, B2 is 1, and B1 is 1, and the voltage Vn that is applied to the inverting terminal (−) of the comparator 520.

A comparison reference voltage that is used in the fourth stage when B3 is 1, B2 is 1, and B81 is 1 may be the 15th comparison reference voltage Vx15. To generate the 15th comparison reference voltage Vx15, the digital-analog converter 550 may apply the intermediate reference voltage VCM to the gate of the first transistor and may apply the first reference voltage VREF+ to the gates of the second to eighth transistors. As a result, the voltage Vn that is input to the inverting terminal (−) of the comparator 520 may be (15/16) *((first reference voltage (VREF+)-second reference voltage (VREF−)).

FIG. 11B illustrates a voltage that is applied to the first to eighth transistors when B3, corresponding to the most significant bit (MSB), is 1, B2 is 1, and B1 is 0, and the voltage Vn that is applied to the inverting terminal (−) of the comparator 520.

A comparison reference voltage that is used in the fourth stage when B3 is 1, B2 is 1, and B1 is 0 may be the 13th comparison reference voltage Vx13. To generate the 13th comparison reference voltage Vx13, the digital-analog converter 550 may apply the intermediate reference voltage VCM to the gates of the first to third transistors and may apply the first reference voltage VREF+ to the gates of the fourth to eighth transistors. As a result, the voltage Vn that is input to the inverting terminal (−) of the comparator 520 may be (13/16)*((first reference voltage (VREF+)-second reference voltage (VREF−)).

FIG. 11C illustrates a voltage that is applied to the first to eighth transistors when B3, corresponding to the most significant bit (MSB), is 1, B2 is 0, and B1 is 1, and the voltage Vn that is applied to the inverting terminal (−) of the comparator 520.

A comparison reference voltage that is used in the fourth stage when B3 is 1, B2 is 0, and B1 is 1 may be the 11th comparison reference voltage Vx11. To generate the 11th comparison reference voltage Vx11, the digital-analog converter 550 may apply the intermediate reference voltage VCM to the gates of the first to fifth transistors and may apply the first reference voltage VREF+ to the gates of the sixth to eighth transistors. As a result, the voltage Vn that is input to the inverting terminal (−) of the comparator 520 may be (11/16)*((first reference voltage (VREF+)-second reference voltage (VREF−)).

FIG. 11D illustrates a voltage that is applied to the first to eighth transistors when B3, corresponding to the most significant bit (MSB), is 1, B2 is 0, and B1 is 0, and the voltage Vn that is applied to the inverting terminal (−) of the comparator 520.

A comparison reference voltage that is used in the fourth stage when B3 is 1, B2 is 0, and B1 is 0 may be the ninth comparison reference voltage Vx9. To generate the ninth comparison reference voltage Vx9, the digital-analog converter 550 may apply the intermediate reference voltage VCM to the gates of the first to seventh transistors and may apply the first reference voltage VREF+ to the gate of the eighth transistor. As a result, the voltage Vn that is input to the inverting terminal (−) of the comparator 520 may be (9/16)*((first reference voltage (VREF+)-second reference voltage (VREF−)).

FIGS. 12A, 12B, 12C and 12D are diagrams illustrating an embodiment of a method of generating a comparison reference voltage that is applied in the fourth stage in which the temperature voltage Vtemp is converted into a temperature code Temp Code as described with reference to FIG. 6.

Referring to FIGS. 5, 6, 12A, 12B, 12C and 12D, the first to eighth voltages V1 to V8 that are different from each other may be applied to gate electrodes of the first to eighth transistors.

FIG. 12A illustrates a voltage that is applied to the first to eighth transistors when B3, corresponding to the most significant bit (MSB), is 0, B2 is 0, and B1 is 0, and the voltage Vn that is applied to the inverting terminal (−) of the comparator 520.

A comparison reference voltage that is used in the fourth stage when B3 is 0, B2 is 0, and B1 is 0 may be the first comparison reference voltage Vx1. To generate the first comparison reference voltage Vx1, the digital-analog converter 550 may apply the intermediate reference voltage VCM to the gate of the first transistor and may apply the second reference voltage VREF− to the gates of the second to eighth transistors. As a result, the voltage Vn that is input to the inverting terminal (−) of the comparator 520 may be (1/16)*((first reference voltage (VREF+)-second reference voltage (VREF−)).

FIG. 12B illustrates a voltage that is applied to the first to eighth transistors when B3, corresponding to the most significant bit (MSB), is 0, B2 is 0, and B1 is 1, and the voltage Vn that is applied to the inverting terminal (−) of the comparator 520.

A comparison reference voltage that is used in the fourth stage when B3 is 0, B2 is 0, and B1 is 1 may be the third comparison reference voltage Vx3. To generate the third comparison reference voltage Vx3, the digital-analog converter 550 may apply the intermediate reference voltage VCM to the gates of the first to third transistors and may apply the second reference voltage VREF− to gates of the fourth to eighth transistors. As a result, the voltage Vn that is input to the inverting terminal (−) of the comparator 520 may be (3/16)*((first reference voltage (VREF+)−second reference voltage (VREF−)).

FIG. 12C illustrates a voltage that is applied to the first to eighth transistors when B3, corresponding to the most significant bit (MSB), is 0, B2 is 1, and B1 is 0, and the voltage Vn that is applied to the inverting terminal (−) of the comparator 520.

A comparison reference voltage that is used in the fourth stage when B3 is 0, B2 is 1, and B1 is 0 may be the fifth comparison reference voltage Vx5. To generate the fifth comparison reference voltage Vx5, the digital-analog converter 550 may apply the intermediate reference voltage VCM to the gates of the first to fifth transistors and may apply the second reference voltage VREF− to the gates of the sixth to eighth transistors. As a result, the voltage Vn that is input to the inverting terminal (−) of the comparator 520 may be (5/16)*((first reference voltage (VREF+)−second reference voltage (VREF−)).

FIG. 12D illustrates a voltage that is applied to the first to eighth transistors when B3, corresponding to the most significant bit (MSB), is 0, B2 is 1, and B1 is 1, and the voltage Vn that is applied to the inverting terminal (−) of the comparator 520.

A comparison reference voltage that is used in the fourth stage when B3 is 0, B2 is 1, and B1 is 1 may be the seventh comparison reference voltage Vx7. To generate the seventh comparison reference voltage Vx7, the digital-analog converter 550 may apply the intermediate reference voltage VCM to the gates of the first to seventh transistors and may apply the second reference voltage VREF− to the gate of the eighth transistor. As a result, the voltage Vn that is input to the inverting terminal (−) of the comparator 520 may be (7/16)*((first reference voltage (VREF+)−second reference voltage (VREF−)).

Figure 13:
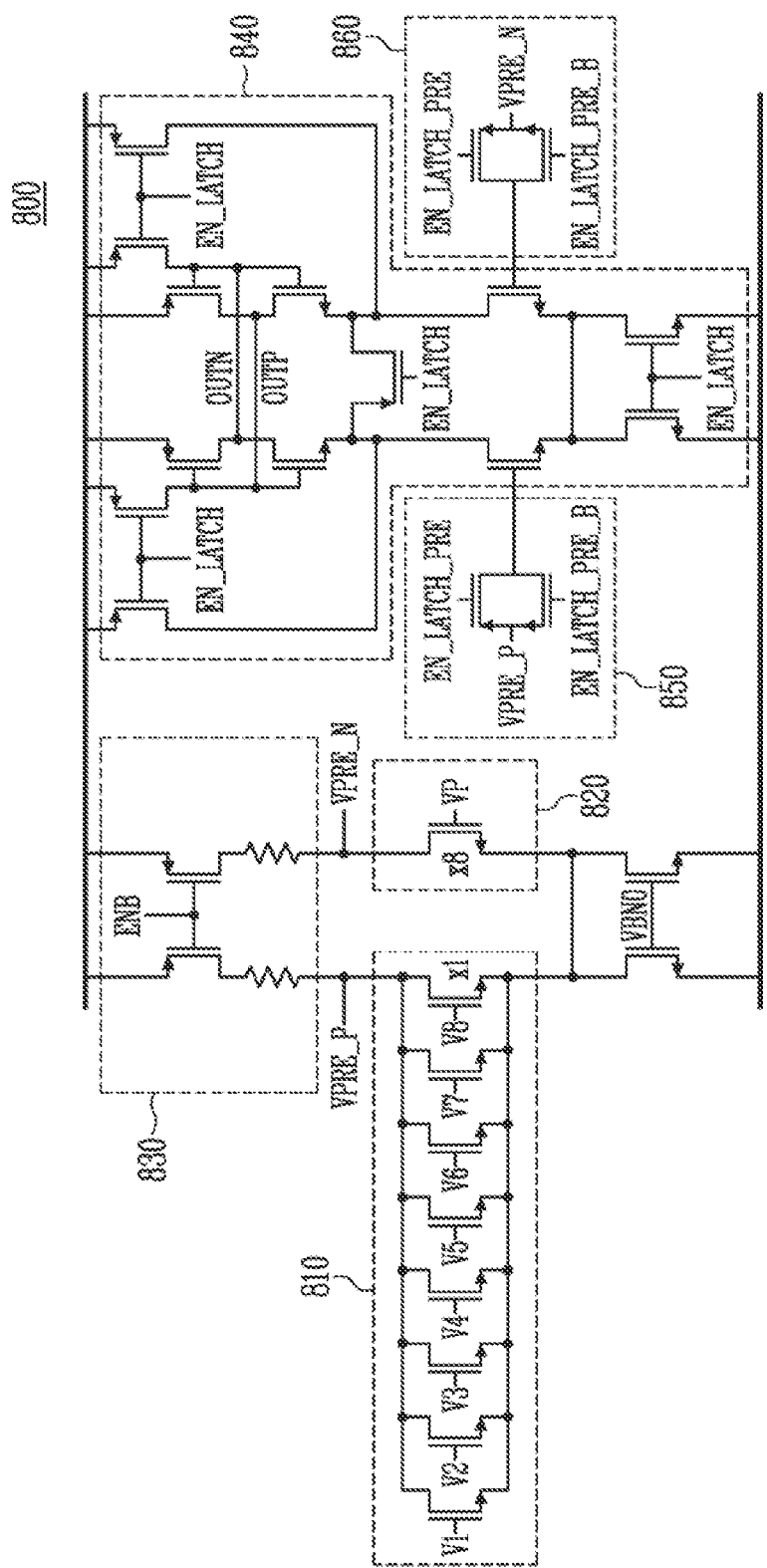
FIG. 13 is a circuit diagram illustrating one embodied example of a comparator included in an analog-digital converter according to an embodiment of the present disclosure.

FIG. 13 is a circuit diagram illustrating one embodied example of a comparator 800 that is included in the analog-digital converter 152 according to an embodiment of the present disclosure.

Referring to FIG. 13, the comparator 800 may compare the voltage Vp that is input through the non-inverting terminal (+) with the voltage Vn that is input through the inverting terminal (−), and may output a comparison result.

The comparator 800 may include a reference voltage input circuit 810, a target voltage input circuit 820, a comparison operation controller 830, a comparison result storage enable circuit 840, and a comparison result storage 860.

The reference voltage input circuit 810 may have first to eighth transistors that are coupled in parallel with each other so as to generate the comparison reference voltages as described above with reference to FIGS. 8 to 12D. The reference voltage input circuit 810 may control gate voltages (V1 to V8) of the first to eighth transistors according to the method described above with reference to FIGS. 8 to 12D. According to an embodiment, an area of a transistor that is included in the target voltage input circuit 820 may be the same as the sum of areas of the first to eighth transistors. The area of the transistor that is included in the target voltage input circuit 820 may be eight times as large as the area of each of the first to eighth transistors. In other words, the area of each of the first to eighth transistors may be 1/8 of the area of the transistor that is included in the target voltage input circuit 820.

The target voltage input circuit 820 may receive the voltage Vp that is input through the non-inverting terminal (+).

The comparison operation controller 830 may compare the voltage Vp that is input through the non-inverting terminal (+) with the voltage Vn that is input through the inverting terminal (−).

The comparison result storage enable circuit 840 may enable a latch to store a comparison result.

The comparison operation controller 860 may store the comparison result between the voltage Vp that is input through the non-inverting terminal (+) and the voltage Vn that is input through the inverting terminal (−).

The other components of the comparator 800, as described with reference to FIG. 13, except for the reference voltage input circuit 810 and the target voltage input circuit 820, may vary according to changes in design.

Figure 14:
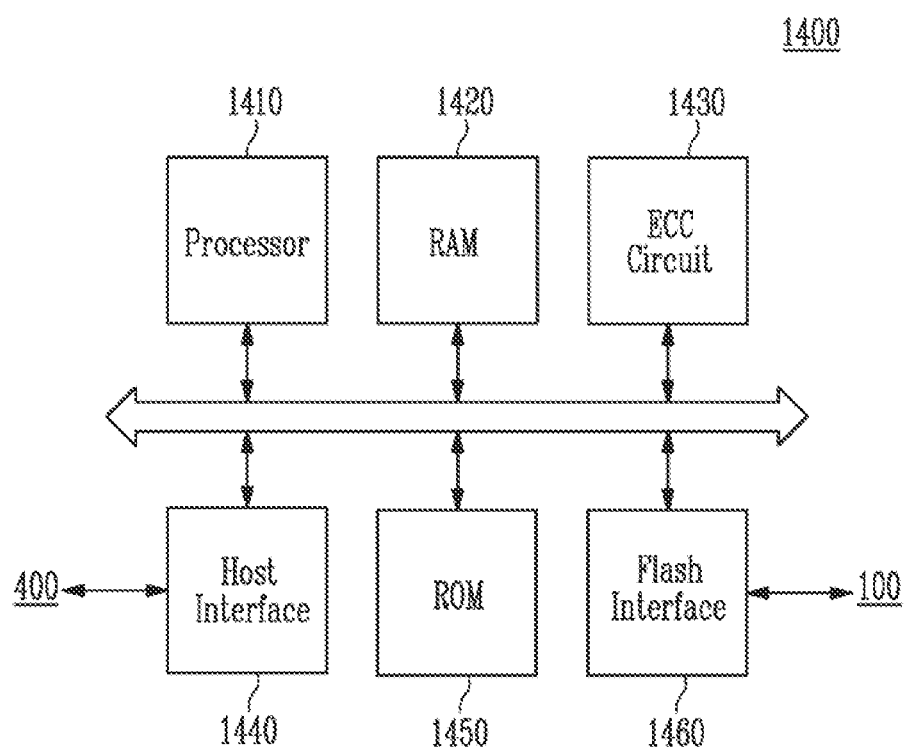
FIG. 14 is a diagram illustrating another embodiment of a memory controller of FIG. 1.

FIG. 14 is a diagram illustrating an embodiment of the memory controller 200 of FIG. 1.

Referring to FIG. 14, a memory controller 1400 may include a processor 1410, a RAM 1420, an error correction code (ECC) circuit 1430, a host interface 1440, a ROM 1450, and a flash interface 1460.

The processor 1410 may control the overall operation of the memory controller 1400. The RAM 1420 may serve as a buffer memory, a cache memory, or a working memory.

The ROM 1450 may store various information, which is required to operate the memory controller 1400, in the form of firmware.

The memory controller 1400 may communicate with an external device (e.g., the host 400, an application processor, and the like) through the host interface 1440.

The memory controller 1400 may communicate with the memory device 100 through the flash interface 1460. The memory controller 1400 may transfer a command CMD, an address ADDR and a control signal CTRL to the memory device 100, and may receive data DATA. For example, the flash interface 1460 may include a NAND interface.

Figure 15:
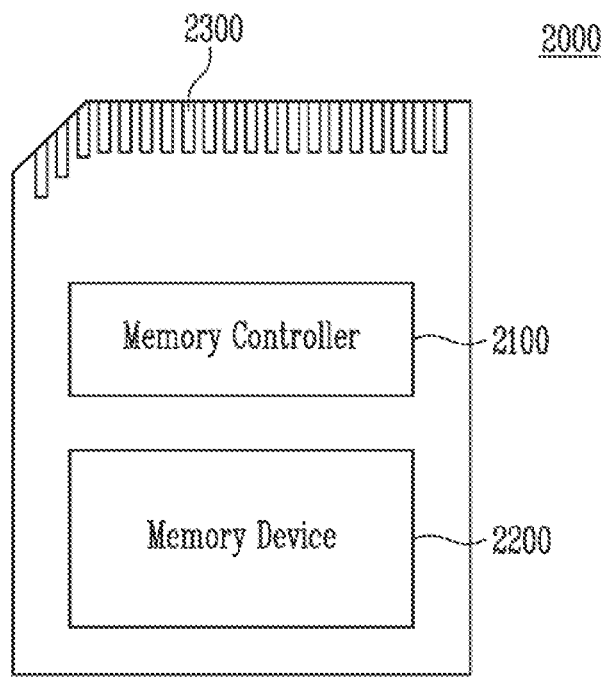
FIG. 15 is a diagram illustrating an embodiment of a memory card system to which a storage device according to an embodiment of the present disclosure is applied.

FIG. 15 is a block diagram illustrating a memory card system 2000 to which a storage device according to an embodiment is applied.

Referring to FIG. 15, the memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, program, erase, and background operations of the memory device 2200. The memory controller 2100 may be configured to provide an interface between the memory device 2200 and the host. The memory controller 2100 may be configured to drive firmware for controlling the memory device 2200. The memory controller 2100 may have the same configuration as the memory controller 200 described above with reference to FIG. 1.

In an embodiment, the memory controller 2100 may include components, such as a Random Access Memory (RAM), a processing unit, a host interface, a flash interface, and an ECC circuit.

The memory controller 2100 may communicate with an external device through the connector 2300. The memory controller 2100 may communicate with an external device (e.g., host) based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin Transfer Torque-Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

Figure 16:
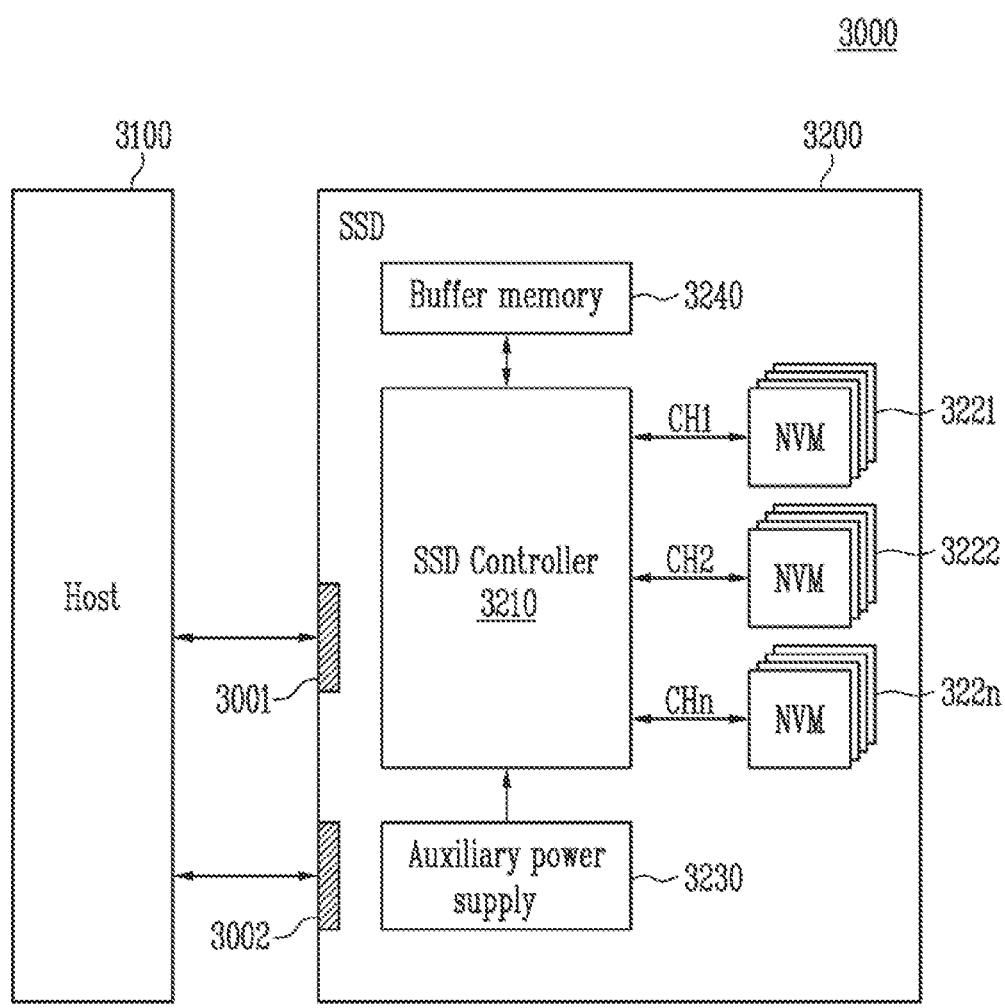
FIG. 16 is a block diagram illustrating a solid state drive (SSD) system to which a storage device according to an embodiment of the present disclosure is applied.

FIG. 16 is a block diagram illustrating a solid state drive (SSD) system to which a storage device according to an embodiment is applied.

Referring to FIG. 16, an SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322*n*, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322*n* in response to the signals received from the host 3100. In an embodiment, the signals may be signals based on the interfaces of the host 3100 and the SSD 3200. For example, the signals may be defined by at least one of various interfaces, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied and charged with power from the host 3100. The auxiliary power supply 3230 may supply the power of the SSD 3200 when power is not smoothly supplied from the host 3100. In an embodiment, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322*n* or may temporarily store metadata (e.g., mapping tables) of the flash memories 3221 to 322*n*. The buffer memory 3240 may include volatile memories, such as DRAM, SDRAM, DDR SDRAM, LPDDR SDRAM, and GRAM, or nonvolatile memories, such as FRAM, ReRAM, STT-MRAM, and PRAM.

Figure 17:
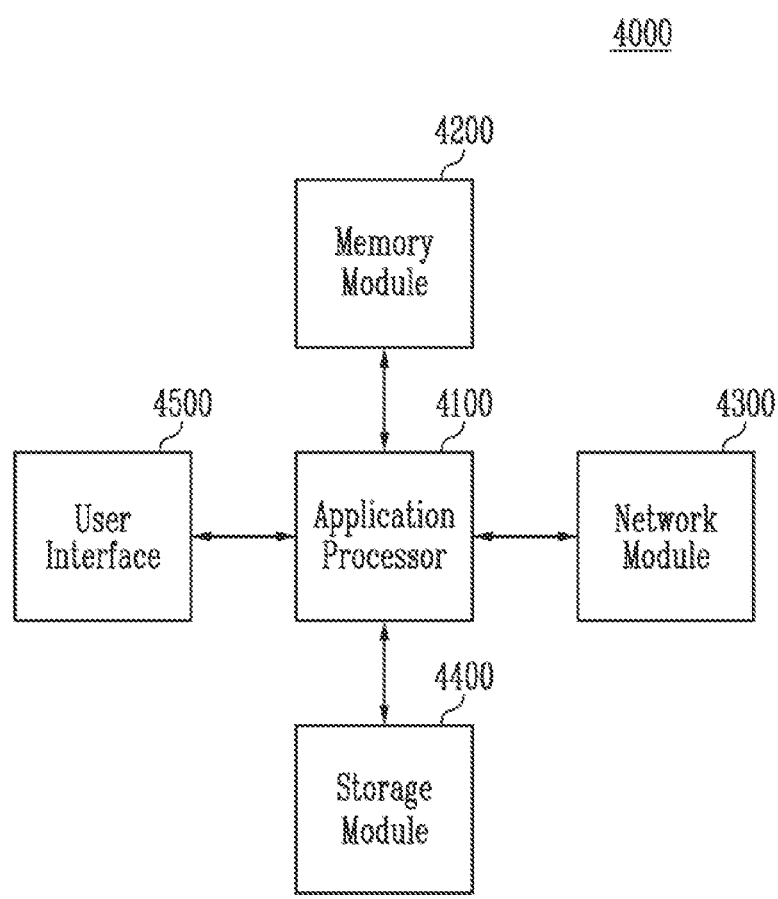
FIG. 17 is a block diagram illustrating a user system to which a storage device according to an embodiment is applied.

FIG. 17 is a block diagram illustrating a user system 4000 to which a storage device according to an embodiment of the present disclosure is applied.

Referring to FIG. 17, the user system 4000 may include an application processor 4100, a memory module 4200, a network module 4300, a storage module 4400, and a user interface 4500.

The application processor 4100 may run components included in the user system 4000, an Operating System (OS), or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs, such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs, such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. In an embodiment, the network module 4300 may be included in the application processor 4100.

The storage module 4400 may store data. For example, the storage module 4400 may store data received from the application processor 4100. Alternatively, the storage module 4400 may transmit the data that is stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory with a three-dimensional (3D) structure. In an embodiment, the storage module 4400 may be provided as a removable storage medium (i.e., removable drive), such as a memory card or an external drive of the user system 400.

For example, the storage module 4400 may include a plurality of non-volatile memory devices, and the plurality of non-volatile memory devices may operate in the same manner as the memory device 100 described above with reference to FIG. 1. The storage module 4400 may be operated in the same manner as the storage device 50 as described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to the present disclosure, an analog-digital converter with a reduced size, a memory device with the analog-digital converter, and an operating method thereof may be provided.

What is claimed is:

1. An analog-digital converter outputting digital data corresponding to comparison results between an input voltage, which is an analog signal, and a plurality of comparison reference voltages, the analog-digital converter comprising:
    an input voltage provider configured to output the input voltage during a plurality of stages;
    a comparator configured to output a comparison result between the input voltage and one of the plurality of comparison reference voltages;
    a successive approximation register configured to output at least one bit among a plurality of bits of the digital data based on the comparison result; and
    a digital-analog converter configured to provide the comparator with one comparison reference voltage among the plurality of the comparison reference voltages based on the at least one bit,
    wherein the digital-analog converter includes a plurality of transistors that are coupled in parallel with each other, the digital-analog converter configured to selectively receive a plurality of reference voltages to generate the one comparison reference voltage,
    wherein an area of each of the plurality of transistors is the same as each other, and
    wherein a sum of areas of the plurality of transistors is the same as an area of a transistor that receives the input voltage.

2. The analog-digital converter of claim 1, wherein the plurality of reference voltages are fewer than the plurality of comparison reference voltages.

3. The analog-digital converter of claim 1, wherein a number of the plurality of bits is equal to a number of times the input voltage is compared with one of the plurality of comparison reference voltages.

4. The analog-digital converter of claim 1, wherein the successive approximation register is configured to output a most significant bit among the plurality of bits based on a comparison result between the input voltage and a comparison reference voltage corresponding to an intermediate value among the plurality of comparison reference voltages.

5. The analog-digital converter of claim 4, wherein the digital-analog converter is configured to provide the comparator with a comparison reference voltage corresponding to an intermediate value among comparison reference voltages that are determined based on the most significant bit among the plurality of comparison reference voltages.

6. The analog-digital converter of claim 5,
    wherein the comparator is configured to compare the input voltage with the comparison reference voltage corresponding to the intermediate value among the comparison reference voltages that are determined based on the most significant bit, and
    wherein the successive approximation register is configured to output a bit next to the most significant bit among the plurality of bits based on a comparison result between the input voltage and the comparison reference voltage corresponding to the intermediate value among the comparison reference voltages that are determined based on the most significant bit.

7. An analog-digital converter, comprising:
    a digital-analog converter configured to generate a plurality of comparison reference voltages from at least one reference voltage that is set beforehand and configured to output the plurality of comparison reference voltages; and
    a comparator with a first input terminal that is configured to receive an input voltage and a second input terminal that receives an output from the digital-analog converter, the comparator configured to output a result of comparing a voltage of the first input terminal with a voltage of the second input terminal,
    wherein the digital-analog converter includes a plurality of transistors coupled in parallel with each other, the digital-analog converter configured to selectively receive the at least one reference voltage,
    wherein an area of each of the plurality of transistors is the same as each other, and
    wherein a sum of areas of the plurality of transistors is the same as an area of a transistor that receives the input voltage.

8. The analog-digital converter of claim 7, further comprising an input voltage provider configured to sample the input voltage and provide a sampled input voltage to the comparator.

9. The analog-digital converter of claim 7, further comprising a successive approximation register configured to output a portion of digital data corresponding to the input voltage based on an output of the comparator.

10. The analog-digital converter of claim 9, further comprising a clock provider configured to provide a clock signal corresponding to a number of times the successive approximation register outputs the portion of the digital data.

11. A memory device, comprising:
    a memory block with a plurality of memory cells storing data;
    a voltage generator configured to generate operating voltages that are used to access the plurality of memory cells;
    a temperature information generator configured to generate a temperature code based on internal temperature; and
    a control logic configured to control the voltage generator to control the operating voltages based on the temperature code,
    wherein the temperature information generator comprises:
    a sensor configured to generate a temperature voltage signal being an analog signal that is determined based on the internal temperature; and
    an analog-digital converter configured to convert the temperature voltage signal into a digital signal,
    wherein the analog-digital converter comprises:
    a comparator configured to output a comparison result between the temperature voltage signal and one of a plurality of comparison reference voltages;
    a successive approximation register configured to output at least one bit among a plurality of bits of the temperature code based on the comparison result; and
    a digital-analog converter configured to provide the comparator with one comparison reference voltage among the plurality of the comparison reference voltages based on the at least one bit, and wherein the digital-analog converter includes a plurality of transistors coupled in parallel with each other, the digital-analog converter configured to selectively receive a plurality of reference voltages to generate the one comparison reference voltage, wherein an area of each of the plurality of transistors is the same as each other, and wherein a sum of areas of the plurality of transistors is the same as an area of a transistor that receives the input voltage.

12. The memory device of claim 11, wherein the plurality of reference voltages are fewer than the plurality of comparison reference voltages.

13. The memory device of claim 11, wherein a number of the plurality of bits is equal to a number of times the temperature voltage signal is compared with the one comparison reference voltage among the plurality of comparison reference voltages.

14. The memory device of claim 11, wherein the successive approximation register is configured to output a most significant bit among the plurality of bits based on a comparison result between the temperature voltage signal and a comparison reference voltage corresponding to an intermediate value among the plurality of comparison reference voltages.

15. The memory device of claim 14, wherein the digital-analog converter is configured to provide the comparator with a comparison reference voltage corresponding to an intermediate value among comparison reference voltages that are determined based on the most significant bit among the plurality of comparison reference voltages.

16. The memory device of claim 11, wherein the operating voltages include a program voltage that is used to store data in the plurality of memory cells and a read voltage for reading the data that is stored in the plurality of memory cells.

17. The memory device of claim 16, wherein the control logic is configured to control the voltage generator to decrease the read voltage by a predetermined level in response to the temperature code that indicates that the internal temperature is higher than critical temperature.

18. The memory device of claim 16, wherein the control logic is configured to control the voltage generator to increase the read voltage by a predetermined level in response to the temperature code that indicates that the internal temperature is lower than critical temperature.

19. The memory device of claim 16, wherein the control logic is configured to control the voltage generator to increase the program voltage by a predetermined level in response to the temperature code that indicates that the internal temperature is higher than critical temperature.

20. The memory device of claim 16, wherein the control logic is configured to control the voltage generator to decrease the program voltage by a predetermined level in response to the temperature code that indicates that the internal temperature is lower than critical temperature.

* * * * *